United States Patent
Coffman et al.

(10) Patent No.: US 7,171,171 B1
(45) Date of Patent: Jan. 30, 2007

(54) GAAS RF SIGNAL DETECTION CIRCUIT WITH OPERATIONAL AMPLIFIER

(75) Inventors: Timothy K. Coffman, Chandler, AZ (US); Tracy S. Martin, Phoenix, AZ (US); Michael S. LaBelle, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 424 days.

(21) Appl. No.: 10/872,660

(22) Filed: Jun. 21, 2004

Related U.S. Application Data

(60) Provisional application No. 60/495,372, filed on Aug. 15, 2003.

(51) Int. Cl.
*H04B 1/04* (2006.01)
*H03G 3/20* (2006.01)

(52) U.S. Cl. .................. 455/126; 455/127.1; 455/115.1; 455/91; 330/140; 330/129

(58) Field of Classification Search ................ 455/126, 455/127.1, 127.2, 127.3, 127.4, 127.5, 115.1, 455/115.4, 114.1, 114.3, 91; 330/53, 140, 330/129, 133, 134, 144, 279, 288, 289, 284
See application file for complete search history.

(56) References Cited

U.S. PATENT DOCUMENTS

| | | | | |
|---|---|---|---|---|
| 4,563,775 A | * | 1/1986 | Yokosuka | ..................... 455/126 |
| 5,043,672 A | | 8/1991 | Youn | ............................ 330/129 |
| 5,117,505 A | * | 5/1992 | Talwar | ..................... 455/278.1 |
| 5,126,688 A | * | 6/1992 | Nakanishi et al. | ........ 455/127.2 |
| 5,376,895 A | * | 12/1994 | Aihara | ......................... 455/126 |
| 5,448,770 A | | 9/1995 | Hietala et al. | .............. 455/126 |
| 5,646,578 A | * | 7/1997 | Loh et al. | .................... 330/279 |
| 5,724,003 A | * | 3/1998 | Jensen et al. | ................ 330/140 |
| 5,832,373 A | * | 11/1998 | Nakanishi et al. | .......... 455/126 |
| 5,880,631 A | * | 3/1999 | Sahota | ........................ 330/288 |
| 5,977,831 A | * | 11/1999 | Davis et al. | ................. 330/279 |
| 6,069,528 A | * | 5/2000 | Kashima | ....................... 330/53 |
| 6,417,729 B1 | * | 7/2002 | Lemay et al. | ................ 330/140 |
| 6,528,983 B1 | | 3/2003 | Augustine | ..................... 324/95 |
| 6,670,849 B1 | * | 12/2003 | Damgaard et al. | .......... 330/129 |
| 6,731,915 B1 | * | 5/2004 | Tran et al. | ................ 455/114.1 |
| 6,788,138 B1 | * | 9/2004 | Suzuki | ........................ 330/129 |
| 2004/0075499 A1 | * | 4/2004 | Dupuis et al. | ............ 455/127.1 |

OTHER PUBLICATIONS

Alpha Industries, Inc. "DD02-92 Directional Detector", Preliminary Specification Document, Jun. 2001.
Conexant. "RF142: Heterojunction Bipolar Transistor Power Amplifier Dual-Band Controller for GSM and PCS Applications", Nov. 23, 1999.
ON Semiconductor. "NCS5000: Integrated RF Schottky Detector", Product Specification Document Rev. Sep. 2, 2001.

* cited by examiner

*Primary Examiner*—Lana Le
(74) *Attorney, Agent, or Firm*—Withrow & Terranova, PLLC

(57) ABSTRACT

A mobile terminal senses transmitted power in a Gallium Arsenide (GaAs) circuit. The GaAs circuit provides a steady reference voltage through the use of an operational amplifier and feedback circuit. The operational amplifier drives the bases of two transistors to create balanced signals that are then used by a detection circuit.

20 Claims, 6 Drawing Sheets

GAAS RF SIGNAL DETECTION CIRCUIT WITH OPERATIONAL AMPLIFIER

This application claims the benefit of provisional patent application Ser. No. 60/495,372, filed Aug. 15, 2003, the disclosure of which is hereby incorporated by reference in its entirety.

FIELD OF THE INVENTION

The present invention relates to sensing power output of a power amplifier in a transmitter and particularly to a circuit that senses the power output and is implemented in a Gallium Arsenide (GaAs) circuit.

BACKGROUND OF THE INVENTION

Wireless transmitters have become ubiquitous in today's society. Such transmitters can be found in myriad mobile terminals such as mobile telephones, personal digital assistants, laptops with wireless modems, and the like. Such transmitters usually have a transceiver circuit that prepares a signal for transmission, a power amplifier that boosts the signal to an elevated power level for transmission, and an antenna that acts as the air interface for the transmitter.

Due to the proliferation of these wireless devices and the potential for interference therebetween as well as interference with other electronic devices, standards have been promulgated both by the Federal Communications Commission (FCC) and by the various governing bodies that limit emissions for certain types of wireless devices. For example, in Code Division Multiple Access (CDMA) systems, very stringent rules control the power levels of CDMA devices within a cell. This helps limit cross channel interference to acceptable levels. While CDMA systems have one of the more visible power control algorithms, other standards and protocols may also be concerned with controlling the power of transmitters. As another example, Global System for Mobile Communications (GSM) has particular requirements specified in GSM Recommendations 05.05 (subsections 4.2.2 and 4.5.2, and Annex 2) that control the spectral frequency mask for the ramp up and ramp down of the power amplifier output. The GSM rules are in place to prevent interference between communications occurring in time slots operating at the same frequency.

To control power output by transmitters, most transmitters incorporate some form of feedback loop that measures the power proximate the antenna of the transmitter. Specifically, most conventional transmitters measure the power levels between the power amplifier and the antenna. Then, the gain of the power amplifier is adjusted so that the power amplifier outputs the desired output power based on the measured power levels.

As an alternative to the feedback loop used by many manufacturers, the assignee of the present invention makes the RF 5117 power amplifier which incorporates power sense circuitry into the power amplifier. While this methodology is suitable for many applications, it remains possible that the designers of mobile terminals may have different requirements in which having the power sense circuitry incorporated into the power amplifier is unacceptable.

Prior to the technique used in the RF 5117, most detection circuits used a detector diode and capacitor to form a half-wave rectifier. The output of this detector was then compared to a reference voltage. The comparison generated an error signal that was used to control the gain of the amplifier. This arrangement worked reasonably well, but errors in the difference between the reference voltage and the output of the detector translated to inaccurate power levels being output by the amplifier. Two common sources of error in this difference are temperature variations or variations in the power supply voltage.

Motorola has produced a detector that is reasonably tolerant to changes in temperature and power supply voltages as evidenced by U.S. Pat. No. 5,448,770. However, this device has been made in a silicon bipolar process and is unsuitable for implementation in a Gallium Arsenide (GaAs) process. GaAs provides a higher breakdown voltage, has a lower forward turn-on voltage, lower series resistance, and a high cut-off frequency. This combination of factors makes the use of GaAs for circuit design attractive. Thus, there remains a need for a detector that is resistant to errors that result from changes in temperature, resistant to errors that result from variations in power supply voltages, and is capable of being implemented in GaAs processes.

SUMMARY OF THE INVENTION

The present invention is designed to be implemented as part of a power detection circuit in a mobile terminal. Further, the present invention is adapted to be manufactured as part of a Gallium Arsenide (GaAs) process. Specifically, the present invention is an operational amplifier with a feedback circuit designed to sit between a voltage reference source and a detector circuit. The operational amplifier and its feedback loop create a stable signal that can then be used by the detector circuit when evaluating signals sensed proximate the antenna for power control purposes.

In particular, in a first, preferred embodiment, the voltage reference source outputs a voltage reference (Vref) that is fed to the negative terminal of the operational amplifier. The operational amplifier drives the bases of two transistors. The collector of one transistor is connected to the positive terminal of the operational amplifier forming a feedback circuit. The emitters of the transistors generate balanced signals that are provided to the detector circuit.

A signal indicative of transmitted power levels is derived from the antenna and is provided to the detector circuit. By selecting the resistances within the detector circuit appropriately, the detector circuit outputs a first signal indicative of the signal, a power detected signal, at the antenna such that it can be used for power control purposes and a second signal indicative of the reference voltage, which can be used to compensate for the reference voltage in the power detected signal. The use of both the first and second signal creates a differential power detection method. In an alternate embodiment, the method uses only the first signal as an absolute power detection method.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a control circuit that helps stabilize a voltage reference source used in a power control detection circuit. The control circuit is well suited for implementation in Gallium Arsenide (GaAs), which helps provide stability for the voltage reference source. Specifically, the present invention is an operational amplifier with a feedback loop that sits between a voltage reference source and a detector circuit.

Figure 1:
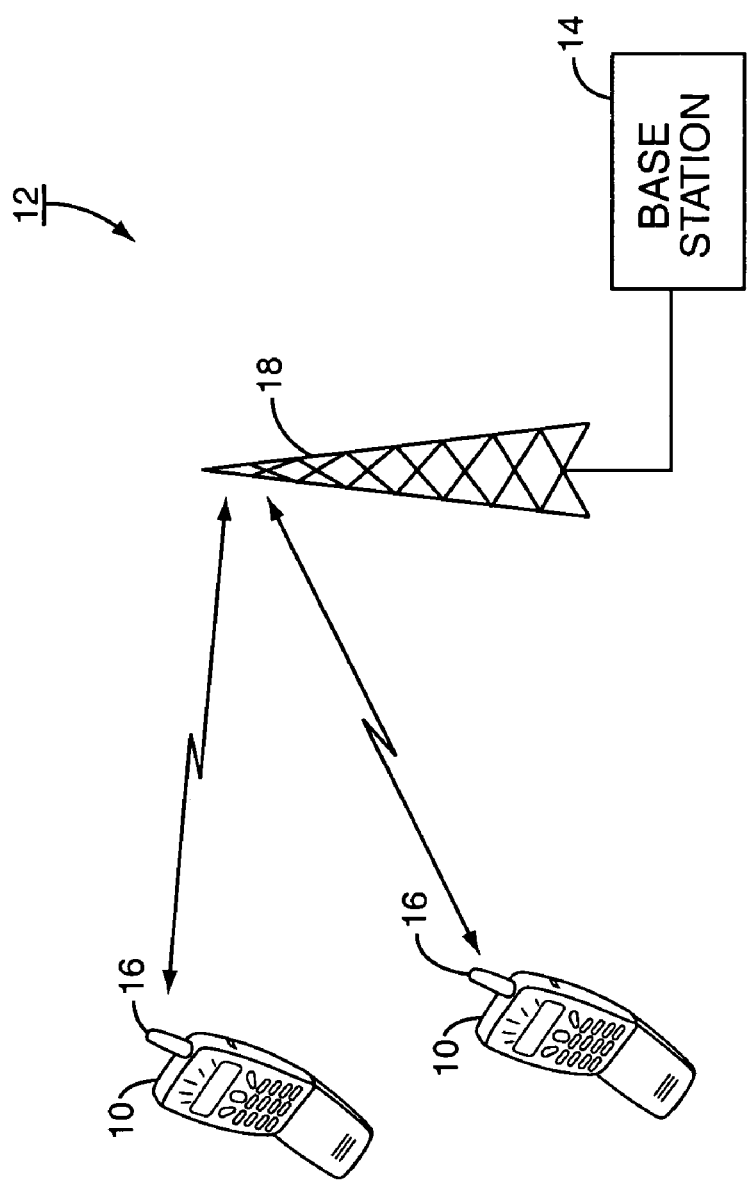
FIG. 1 illustrates a mobile communications environment.

The present invention is well suited for use in a mobile terminal such as a cellular telephone. However, the present invention is not restricted to such environments. Other wireless devices and wireless communications environments are possible, and the use of the present invention in such environments is contemplated. However, for the purposes of illustrating the present invention, the following discussion will assume that a mobile terminal, such as mobile terminals 10 in FIG. 1, operate as cellular telephones in a global system for mobile communications (GSM) standard communication environment 12. Thus, mobile terminals 10 communicate with base station 14 through mobile terminal antennas 16 and base station antenna 18 as is well understood. The GSM protocol has strict power control requirements during the ramp up and ramp down of a transmission. These requirements reduce interference between mobile terminals 10 transmitting in different time slots in the same channel.

Figure 2:
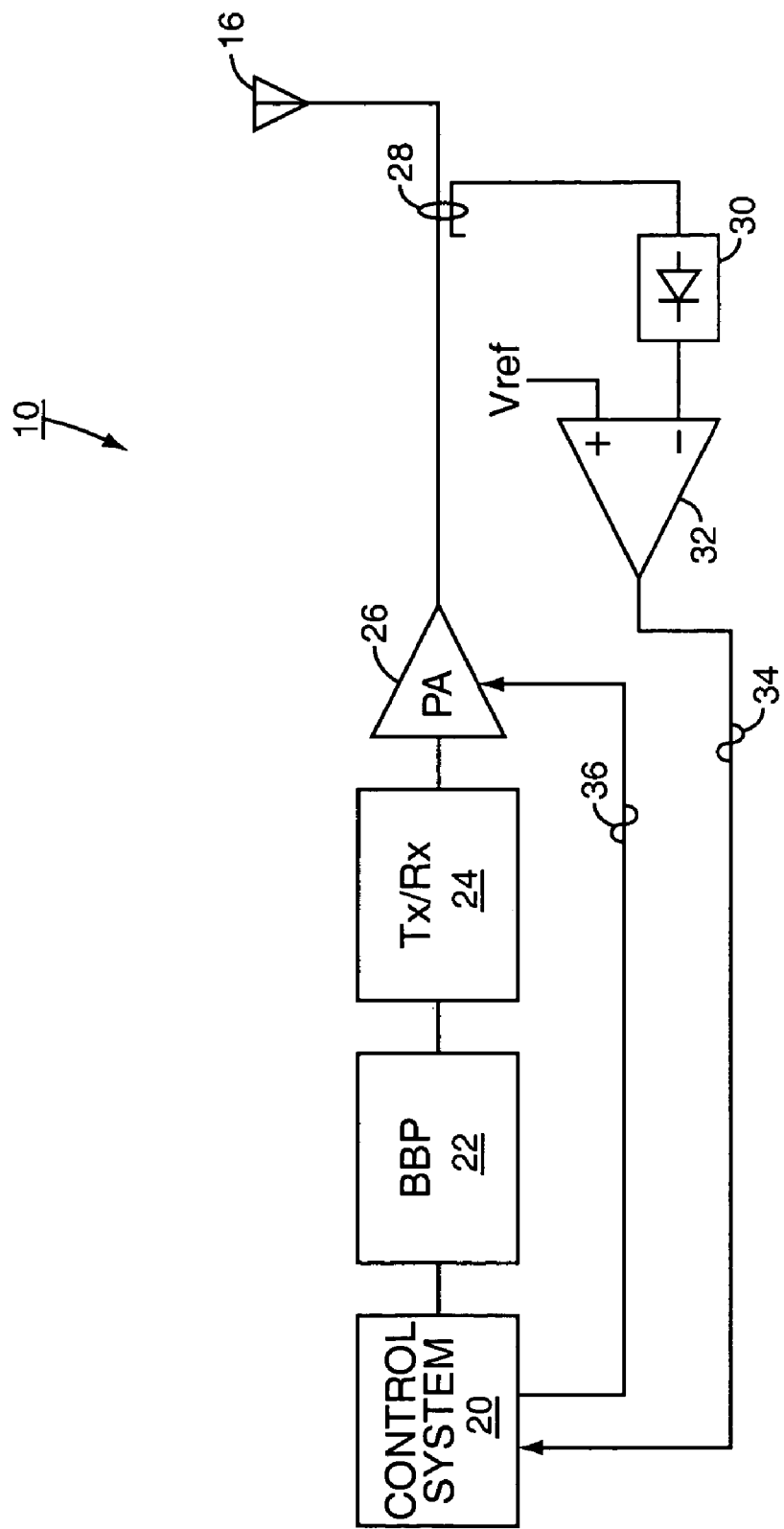
FIG. 2 illustrates a block diagram of a convention mobile terminal with power detection and control circuitry.

A more detailed view of an exemplary mobile terminal 10 is presented in FIG. 2, complete with a prior art power sense circuit. The mobile terminal 10 includes a control system 20 that receives input from and provides output to a user interface (not shown) such as a microphone, number pad, speaker, and display as is well understood. The control system operates with a baseband processor (BBP) 22. The BBP 22 performs initial coding on the signals from the control system 20 and passes the signal to be transmitted to the transceiver (Tx/Rx) 24. The transceiver 24 up-converts the frequency from the baseband to a radio frequency (RF) by mixing the baseband signal with a carrier signal. This radio frequency signal is passed to a power amplifier (PA) 26 for amplification to a level suitable for transmission. The amplified signal is passed to the antenna 16.

A passive coupling 28 couples the signal that passes from the power amplifier 26 to the antenna 16 to a diode detector circuit 30. Passive coupling 28 may be a first conductor positioned proximate a second conductor that carries the signal to the antenna 16 that capacitively couples the signal from the second conductor to the first conductor or similar arrangement. Likewise, it is conceivable that the passive coupling 28 could be replaced with an active coupling, but an active coupling would reduce performance at the antenna 16, and thus is generally not desirable. The output of the diode detector circuit 30 is passed to a comparator 32 which compares the output from the diode detector circuit 30 to a reference voltage (Vref). The comparison results in the generation of an error signal 34, which is passed to the control system 20. Based on the error signal 34, the control system 20 generates a control signal 36 which controls the gain provided by the power amplifier 26. Alternatively, the error signal 34 may be sent to the baseband processor 22, which generates the control signal 36 (not shown). While either arrangement provides effective power control, both are susceptible to temperature variations, which may create a skew in the error signal 34. The skew in the error signal 34 causes the control signal 36 to adjust the power amplifier 26 incorrectly and results in generally poor power control.

Figure 3A:
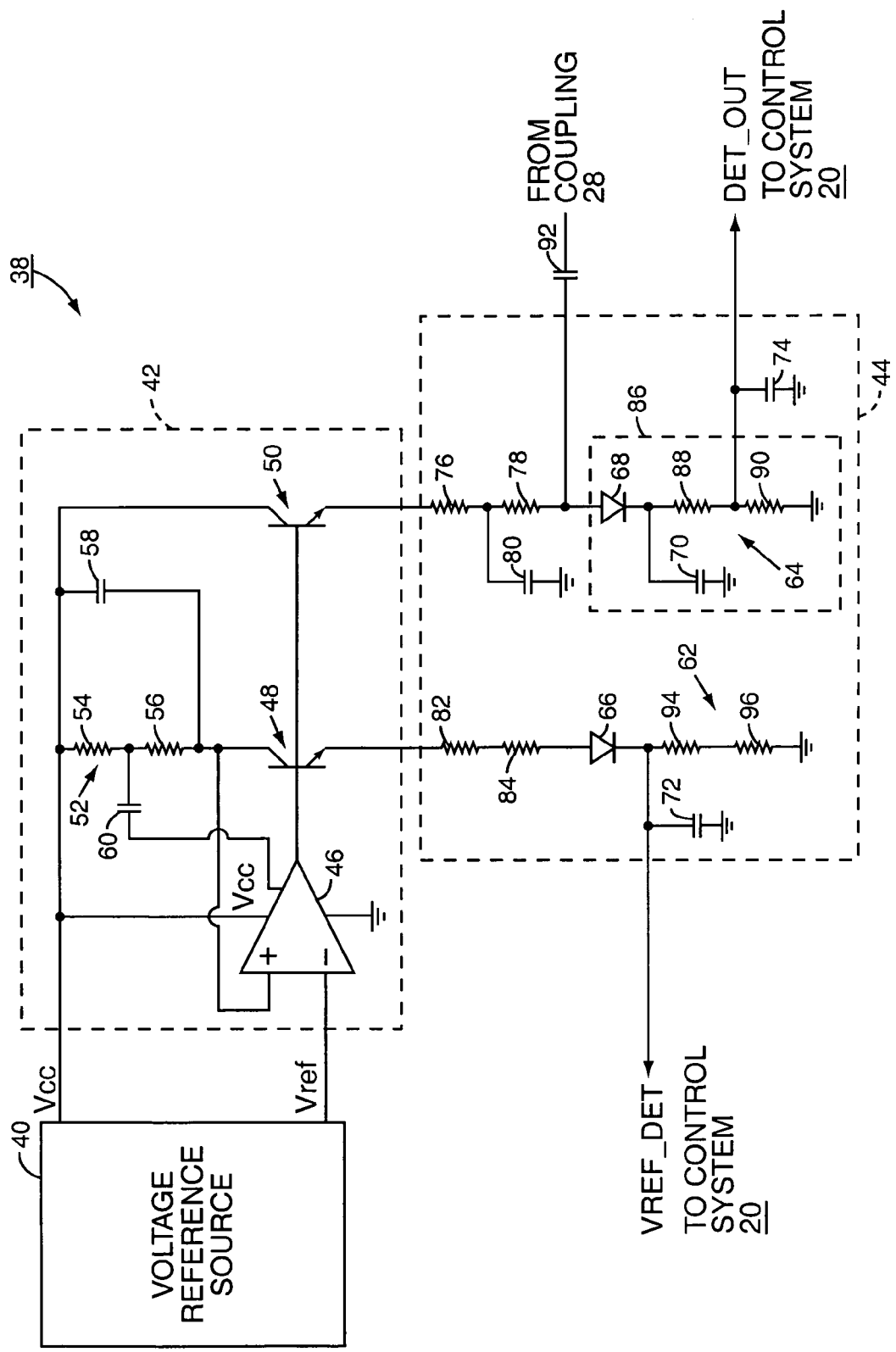
FIG. 3A illustrates a circuit diagram of a first embodiment of the power detection circuitry of the present invention.
Figure 5C:
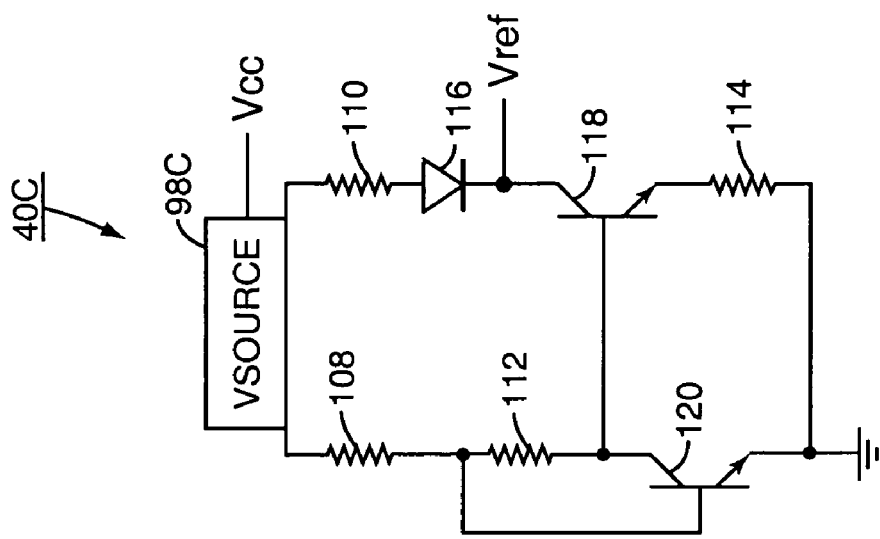
FIGS. 5A–5C illustrate alternate voltage reference sources that may be used with the present invention.

A first embodiment of the present invention is presented in FIG. 3A, which illustrates a detection circuit 38. Detection circuit 38 includes a voltage reference source 40, a reference control circuit 42, and a detector circuit 44. The voltage reference source 40 outputs a first voltage signal (Vcc) and a second voltage signal (Vref) and passes these two voltage signals to the reference control circuit 42. More detail about suitable voltage reference sources 40 is provided below with reference to FIGS. 5A–5C.

Detector circuit 44 may be used in one of two ways. In a first embodiment, detector circuit 44 may be used to generate differential signals which are then used together to help the control system 20 determine a control signal 36. Alternatively, only an absolute detected signal may be used by the control system 20 to determine a control signal 36. In either case, the structure of circuits remains essentially the same.

The reference control circuit 42 includes an operational amplifier 46 (described in greater detail below with reference to FIG. 3B), a first transistor 48, a second transistor 50, and a resistor 52 (having a resistive value of R), which is, in this exemplary embodiment, two resistors 54, 56. The first transistor 48 and the second transistor 50 are preferably bipolar NPN matched transistors. Optional capacitors 58, 60 may be included to provide additional stability, but are not critical to the operation of the reference control circuit. The Vcc signal from the voltage reference source 40 provides power to the operational amplifier 46 and the collectors of the first transistor 48 and the second transistor 50 as illustrated. It should be appreciated that there is a voltage drop across the resistor 52 such that the voltage at the collector of the first transistor 48 is less than Vcc. It is possible that the collector of second transistor 50 will draw too much current from Vcc and thus, an alternate voltage source may be provided. Specifically contemplated is tying the collector of the second transistor 50 directly to a battery (not shown) so that the appropriate current can be provided.

The operational amplifier 46 receives the Vref signal from the voltage reference source 40 at the negative terminal. The operational amplifier 46 outputs a signal that is presented to the base of the first transistor 48 and the base of the second transistor 50. The signal at the base of the first transistor 48 produces an error signal at the collector of the first transistor 48. This error signal is fed back to the positive terminal of the operational amplifier 46.

The feedback from the collector of the first transistor 48 to the positive terminal of the operational amplifier 46 holds the voltage across the resistor 52 equal to the difference between Vcc and Vref. Thus, a current corresponding to (Vcc−Vref)/R flows through the first transistor 48. Because the first transistor 48 and the second transistor 50 are matched transistors coupled to matched signal paths, identical current flows through the second transistor 50. These two currents establish a zero RF, DC reference and detector voltages for the detector circuit 44.

The detector circuit 44 includes a reference resistance 62, a detector resistance 64, a reference diode 66, a detector diode 68, a detector capacitor 70, a reference capacitor 72, a filtering capacitor 74, isolating resistors 76, 78, isolating capacitor 80, and balancing resistors 82, 84. The reference diode 66 and the detector diode 68 are preferably matched Schottky diodes. The emitters of the first transistor 48 and the second transistor 50 are coupled to balanced signal paths in the detector circuit 44. That is, the voltage drop across resistors 82, 84, reference diode 66, and reference resistance 62 (the reference signal path) should match the voltage drop across resistors 76, 78, detector diode 68, and detector resistance 64 (the detector signal path). These matched signal paths help insure that the current passing through the first transistor 48 matches the current passing through the second transistor 50.

The detector circuit 44 receives the signal from the coupling 28 (FIG. 2) and outputs two signals, labeled herein VREF_DET and DET_OUT. VREF_DET is the stable reference signal corresponding to Vref. DET_OUT is the detected signal corresponding to the power being transmitted at the antenna 16. In the differential embodiment, signals VREF_DET and DET_OUT are provided to the control system 20 (or the baseband processor 22) to calculate a control signal comparable to the control signal 36 (FIG. 2). In the absolute embodiment, VREF_DET is still generated at the cathode of the reference diode 66, but is not used, and is not sent to the control system 20. The two output signals VREF_DET and DET_OUT are generated by the reference signal path and the detection signal path, respectively.

Specifically, the reference signal path is coupled to the emitter of the first transistor 48. In the differential embodiment, the reference signal path is tapped at the cathode of the reference diode 66 to derive VREF_DET. The reference capacitor 72 is added to reduce noise on VREF_DET. Since the first transistor 48 provides additional gain and phase shift, reference capacitor 72 also has some influence on loop stability. As explained above, in the absolute embodiment, VREF_DET is still generated in that there is still a signal at the cathode of the reference diode 66 corresponding to VREF_DET, but the reference signal path is not tapped, the reference capacitor 72 is not needed, and VREF_DET is not sent to the control system 20.

The detector signal path includes a half-wave rectifier 86. Half-wave rectifier 86 includes detector diode 68, detector capacitor 70, and detector resistance 64. The detector resistance 64 may include separate resistors 88, 90. The signal from the coupling 28 is coupled to the detector diode 68 through a capacitor 92. During positive transitions of the incoming signal from coupling 28, the detector diode 68 conducts and charges the detector capacitor 70 to produce the DET_OUT signal on the detector resistance 64 and the filtering capacitor 74. During negative transitions, the detector diode 68 does not conduct. The resulting signal on the cathode of the detector diode 68 is a half-wave rectified representation of the signal from the coupling 28. The detector signal path is tapped between the resistors 88, 90 to derive DET_OUT. Therefore, when properly filtered, the DC voltage produced within DET_OUT is representative of the power level at the antenna 16.

In use, the second transistor 50 provides a bias current to the capacitor 92 during negative input signal swings. As the input signal increases, the DC level on detector resistance 64 increases proportionately, thereby requiring an increased bias current. The second transistor 50 supplies an average current equal to the demands of the half-wave rectifier 86. The magnitude of the dynamic or frequency dependent current supplied by the second transistor 50 is dependent on the filtering provided by the isolating capacitor 80. Further, the resistors 76, 78 and the isolating capacitor 80 provide RF isolation of the emitter of the second transistor 50 to avoid interfering with the RF signal and to avoid excessively large spikes at the emitter of the second transistor 50. Capacitors 70, 74 filter the RF components for the detector signal path, leaving only the DC detected component for DET_OUT. Note that if the transistor 50 did not provide the bias current then the detected voltage would build up on the capacitor 92 and not the output since the detector resistance 64, detector diode 68, and capacitor 92 would form a clamping circuit to zero volts at the junction of detector diode 68 and the capacitor 92.

The reference resistance 62 may include two resistors 94, 96. The resistors 94, 96 preferably have a collective resistance equal to that of the collective resistance of the resistors 88, 90 of the detector resistance 64. The ratio of the values of the various resistors 88, 90, 94, 96 may be chosen so that a predetermined offset voltage exists between VREF_DET and DET_OUT. That is, the difference in resistors 88, 90, 94, 96 and the location of the taps used to derive VREF_DET and DET_OUT allows a predetermined offset voltage to be established therebetween.

Figure 3B:
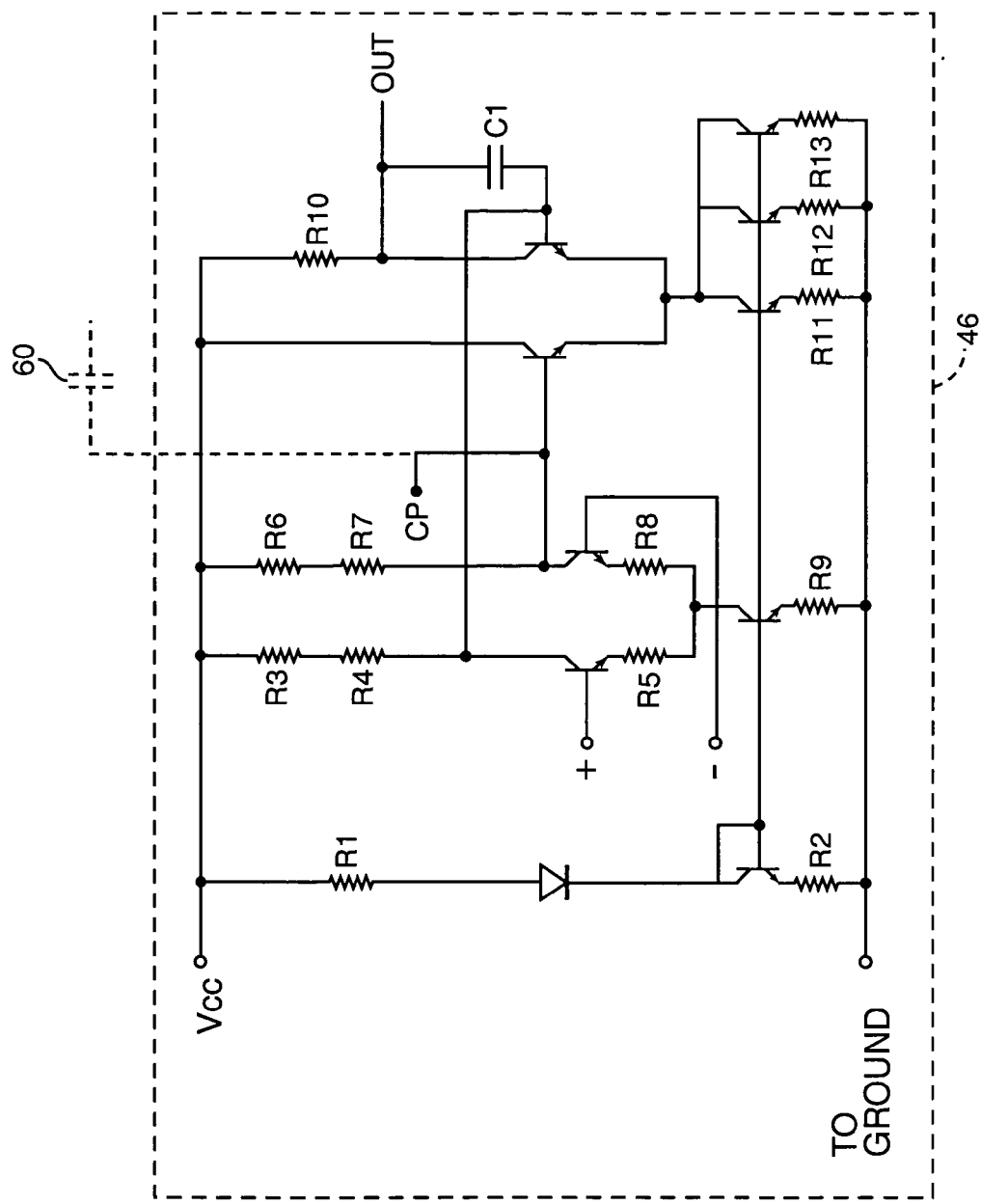
FIG. 3B illustrates a circuit diagram of the operational amplifier of FIG. 3A.

As illustrated in FIG. 3B, the operational amplifier 46 has a typical two-stage amplifier structure with conventional inputs Vcc, Ground, a positive terminal (labeled +), and a negative terminal (labeled −), as well as a conventional output (labeled OUT). This is well known in the literature. Furthermore, the operational amplifier has another input (labeled CP) to which optional capacitor 60 is connected. The values of the resistors (R1–R13) and the capacitor C1 within the operational amplifier 46 may be chosen as needed to have the desired performance and in particular can be changed to provide adequate loop gain, dc accuracy, loop stability, bandwidth, voltage and/or current ranges, and the like.

By implementing the present invention in Gallium Arsenide (GaAs), the aforementioned benefits of GaAs are achieved and the circuit is relatively stable over a wide range of temperature and operating conditions.

While the detector circuit 44 is illustrated with a particular structure, it should be appreciated that other detector circuits could also be used without departing from the spirit of the present invention, and a particular detector circuit 44 is not required.

Figure 4:
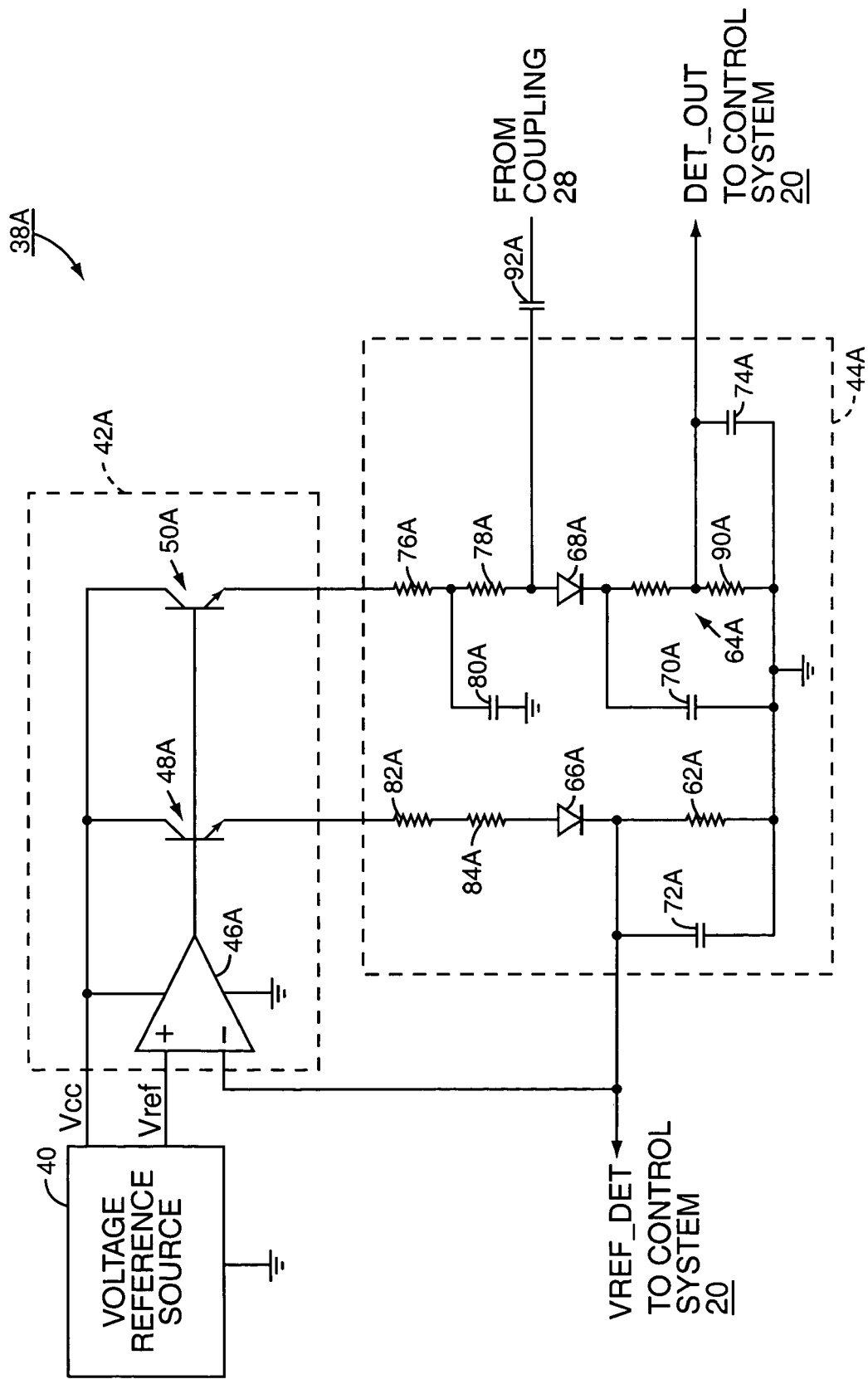
FIG. 4 illustrates a circuit level diagram of a second embodiment of the power detection circuitry of the present invention.

Another embodiment of the present invention is illustrated in FIG. 4. The detection circuit 38A includes the voltage reference source 40, a modified reference control circuit 42A, and a detector circuit 44A. The detector circuit 44A is substantially similar to the detector circuit 44, and as such the components are numbered the same, albeit distinguished from detector circuit 44 by the addition of an "A." To avoid unnecessary duplication of description, the components are not detailed again, except where different. In this embodiment, Vref is presented to the positive terminal of the operational amplifier 46A and the feedback loop comes from the VREF_DET signal. The feedback signal is presented to the negative terminal of the operational amplifier 46A. Since VREF_DET is sampled directly and is set directly, there are potentially fewer sources of error in this embodiment.

The particular voltage reference source 40 is not critical to the present invention. However, for the sake of completeness, three exemplary voltage reference sources 40A–40C are presented in FIGS. 5A–5C, respectively. The voltage reference 40A of FIG. 5A comprises a voltage source (VSOURCE) 98A, such as a battery, that is connected to a serial resistor 100 and a current source 102. Vref is equal to the current of the current source 102 multiplied by the resistance of the resistor 100 and is output therebetween.

Figure 5B:
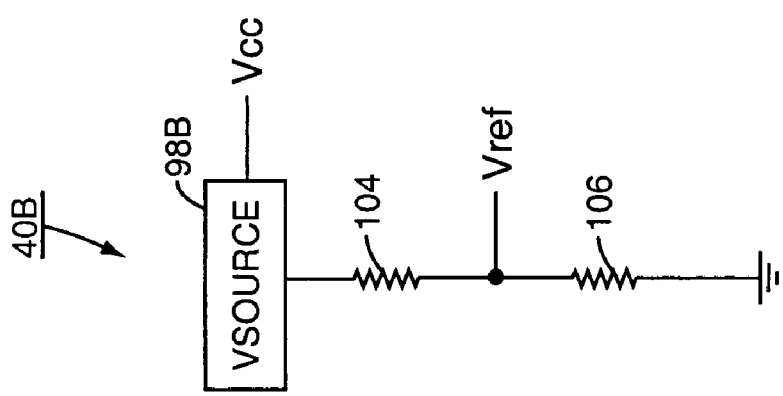
Figure 5A:
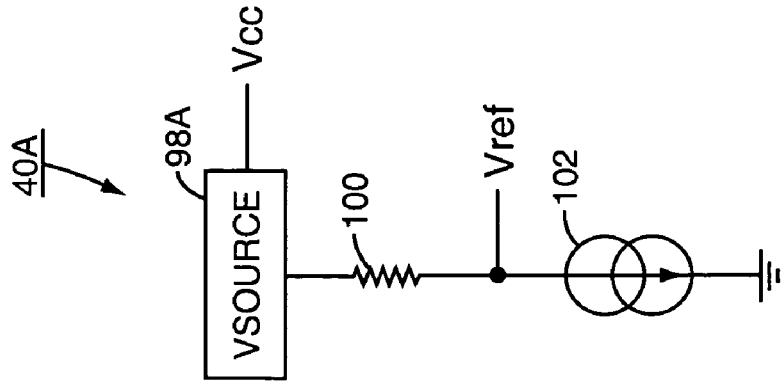

The voltage reference source 40B of FIG. 5B comprises a voltage source (VSOURCE) 98B, such as a battery that is connected to two resistors 104, 106. The resistors 104, 106 form a voltage divider that determines Vref output therebetween. This is the preferred voltage reference source 40 of the present invention.

The voltage reference source 40C of FIG. 5C is a bit more complex and comprises resistors 108, 110, 112, and 114 as well as diode 116 and transistors 118 and 120. Collectively, this arrangement provides a very stable Vref at the collector of the first transistor 118.

While a variety of voltage reference sources are illustrated, it should further be appreciated that these voltage reference sources may be made temperature independent, voltage dependent, or otherwise tied to a particular characteristic as needed or desired. Alternatively, temperature independence can be achieved through the use of a temperature independent voltage source as needed or desired.

It should be appreciated that the voltage source (VSOURCE) of each voltage reference source 40A–40C may also output a Vcc signal. The Vcc signal may be the same as the battery voltage level or stepped down as needed or desired. Alternatively, the Vcc signal may be provided by another voltage reference source. The provision of Vcc signals is well understood in the art and a further discussion is omitted.

Those skilled in the art will recognize improvements and modifications to the preferred embodiments of the present invention. All such improvements and modifications are considered within the scope of the concepts disclosed herein and the claims that follow.

What is claimed is:

1. A detection circuit comprising:
   a reference control circuit comprising:
      an operational amplifier receiving a voltage reference signal and generating an output; and
      a feedback loop based at least in part on said output and looping back to said operational amplifier; and
   a detector circuit adapted to:
      receive two signals based on said output;
      receive a third signal from an antenna; and
      generate a fourth signal corresponding to the voltage reference signal and a fifth signal corresponding to the detected signal from the antenna.

2. The detection circuit of claim 1 further comprising a voltage reference source adapted to produce the voltage reference signal.

3. The detection circuit of claim 1 wherein said reference control circuit further comprises a pair of matched transistors, each having a base and each base receiving said output from said operational amplifier.

4. The detection circuit of claim 3 wherein each of said matched transistors has an emitter and generates the two signals based on said output for said detector circuit.

5. The detection circuit of claim 3 wherein said feedback loop extends from a collector on one of said pair of matched transistors to a positive terminal on said operational amplifier.

6. The detection circuit of claim 1 wherein said detection circuit is implemented in gallium arsenide.

7. The detection circuit of claim 1 wherein said voltage reference signal is presented to a negative terminal on said operational amplifier.

8. The detection circuit of claim 1 wherein said voltage reference signal is presented to a positive terminal on said operational amplifier.

9. The detection circuit of claim 8 wherein said feedback loop presents a signal to a negative terminal on said operational amplifier.

10. The detection circuit of claim 1 wherein said fourth signal is not used.

11. The detection circuit of claim 1 wherein said fourth and fifth signals together are used in a differential manner.

12. A method of detecting power levels at an antenna, comprising:
   receiving a voltage reference signal at an operational amplifier;
   generating an output signal within the operational amplifier;
   controlling a base on each of a pair of matched transistors with said output signal;
   generating a feedback signal for the operational amplifier;
   outputting a pair of signals from the pair of matched transistors; and
   using the pair of signals and an antenna signal in a detector circuit to generate a detected signal and a reference signal.

13. The method of claim 12 wherein generating a feedback signal for the operational amplifier comprises taking a signal from a collector of one of the pair of matched transistors.

14. The method of claim 13 wherein generating a feedback signal further comprises presenting the signal from the collector of one of the pair of matched transistors to a positive input on the operational amplifier.

15. The method of claim 12 further comprising implementing circuitry to achieve said method in gallium arsenide.

16. The method of claim 12 wherein generating a feedback signal comprises using the reference signal.

17. The method of claim 12 wherein receiving the voltage reference signal at the operational amplifier comprises receiving the voltage reference signal at a negative terminal of the operational amplifier.

18. The method of claim 12 wherein using the pair of signals in a detector circuit comprises using the pair of signals in a detector circuit having two diodes.

19. The method of claim 12 wherein the reference signal is generated, but not used.

20. The method of claim 12 further comprising using the detected signal and the reference signal in a differential manner.

* * * * *